United States Patent
Xu et al.

(10) Patent No.: US 10,314,195 B1
(45) Date of Patent: Jun. 4, 2019

(54) SERVER

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Jia-Bin Wang, Shanghai (CN); Chao Nie, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/137,370

(22) Filed: Sep. 20, 2018

(30) Foreign Application Priority Data

Aug. 15, 2018 (CN) .......................... 2018 1 0927551

(51) Int. Cl.
   *H05K 7/14* (2006.01)
   *H05K 7/20* (2006.01)

(52) U.S. Cl.
   CPC ......... *H05K 7/1489* (2013.01); *H05K 7/1417* (2013.01); *H05K 7/1439* (2013.01); *H05K 7/1487* (2013.01); *H05K 7/20836* (2013.01)

(58) Field of Classification Search
   CPC .................... H05K 7/1485; H05K 7/1487
   See application file for complete search history.

(56) References Cited

U.S. PATENT DOCUMENTS

| | | | |
|---|---|---|---|
| 8,797,732 B2 * | 8/2014 | Ganta Papa Rao Bala | G11B 33/128 361/679.32 |
| 9,070,419 B1 * | 6/2015 | Zhu | H05K 7/1491 |
| 9,763,352 B2 * | 9/2017 | Jau | G11B 33/128 |
| 9,781,857 B2 * | 10/2017 | Jau | G06F 1/183 |
| 9,918,399 B1 * | 3/2018 | Deng | H05K 7/1487 |
| 10,025,357 B2 * | 7/2018 | Davis | G06F 1/187 |
| 2007/0230111 A1 * | 10/2007 | Starr | G11B 33/125 361/679.31 |
| 2013/0155599 A1 * | 6/2013 | Ross | G06F 1/187 361/679.31 |
| 2014/0117822 A1 * | 5/2014 | Fan | G11B 33/128 312/223.2 |
| 2014/0204525 A1 * | 7/2014 | Pecone | H05K 13/00 361/679.33 |
| 2014/0204537 A1 * | 7/2014 | Rust | G11B 33/128 361/727 |
| 2015/0043146 A1 * | 2/2015 | Li | H05K 7/1487 361/679.31 |
| 2015/0120971 A1 * | 4/2015 | Bae | G06F 3/0626 710/106 |

(Continued)

*Primary Examiner* — Adrian S Wilson
(74) *Attorney, Agent, or Firm* — Maschoff Brennan

(57) ABSTRACT

A server includes a casing, a storage module and a motherboard. The casing includes a chassis and two side plates. The two side plates stand on the chassis. The storage module is disposed on the chassis. The motherboard includes a circuit board, at least one central processing unit, a first amplifier, a second amplifier, a riser card and a third amplifier. The circuit board is disposed on the chassis. The at least one central processing unit, the first amplifier and the second amplifier are disposed on the circuit board. The riser card is disposed on the second amplifier. The third amplifier is disposed on the riser card.

10 Claims, 8 Drawing Sheets

(56) References Cited

U.S. PATENT DOCUMENTS

2016/0081219 A1* 3/2016 Jau .................... G06F 1/183
                                                        361/679.02
2018/0359878 A1* 12/2018 Xu ................... H05K 7/1487

* cited by examiner

SERVER

CROSS-REFERENCE TO RELATED APPLICATIONS

This non-provisional application claims priority under 35 U.S.C. § 119(a) on Patent Application No(s). 201810927551.0 filed in China, on Aug. 15, 2018, the entire contents of which are hereby incorporated by reference.

TECHNICAL FIELD

The disclosure relates to a server, more particularly to a server having a high density of storage unit.

BACKGROUND

With the development of the internet, cloud services that combine the server and the internet together have become widely used in recent years, so the amount of the data that the server needs to process grows at a remarkable speed. This causes a high demand for a server having larger storage space and faster write/read speed.

Generally, the server accommodates not only storage units but also components such as a motherboard, a heat dissipating module and expanding cards. Therefore, the conventional servers have a low density of storage unit under such a circumstance.

SUMMARY OF THE INVENTION

One embodiment of the disclosure provides a server comprising a casing, a storage module and a motherboard. The casing comprises a bottom plate and two side plates. The bottom plate has a first side, a second side, a third side and a fourth side. The first side is opposite to the second side. The third side and the fourth side are located between the first side and the second side. The third side is opposite to the fourth side. The two side plates respectively stand on the first side and the second side. The storage module is disposed on the bottom plate. The storage module comprises a cage, a plurality of sub-cages, a plurality of back panels and a plurality of storage units. The cage is disposed on the two side plates. The plurality of sub-cages are disposed in the cage. The plurality of back panels are respectively disposed in the plurality of sub-cages. The plurality of storage units are respectively detachably disposed in the plurality of sub-cages to electrically connected to the back panel that locates in the same sub-cage. The motherboard comprises a circuit board, at least one central processing unit, a signal output port, a first signal magnifying board, a second signal magnifying board, a riser card and a third signal magnifying board. The circuit board is disposed on the bottom board and located between the storage module and the fourth side. The at least one central processing unit is disposed on a side of the circuit board close the storage module. The signal output port, the first signal magnifying board and the second signal magnifying board are disposed on a side of the circuit board away from the storage module. The first signal magnifying board and the second signal magnifying board are perpendicular to the circuit board and the first signal magnifying board is located closer to the signal output port than the second signal magnifying board. The riser card is disposed on a side of the second signal magnifying board away from the first signal magnifying board. The third signal magnifying board is disposed on a side of the riser card away from the second signal magnifying board and the third signal magnifying board is parallel to the circuit board. The first signal magnifying board, the second signal magnifying board and the third signal magnifying board are electrically connected to the signal output port and the storage module.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
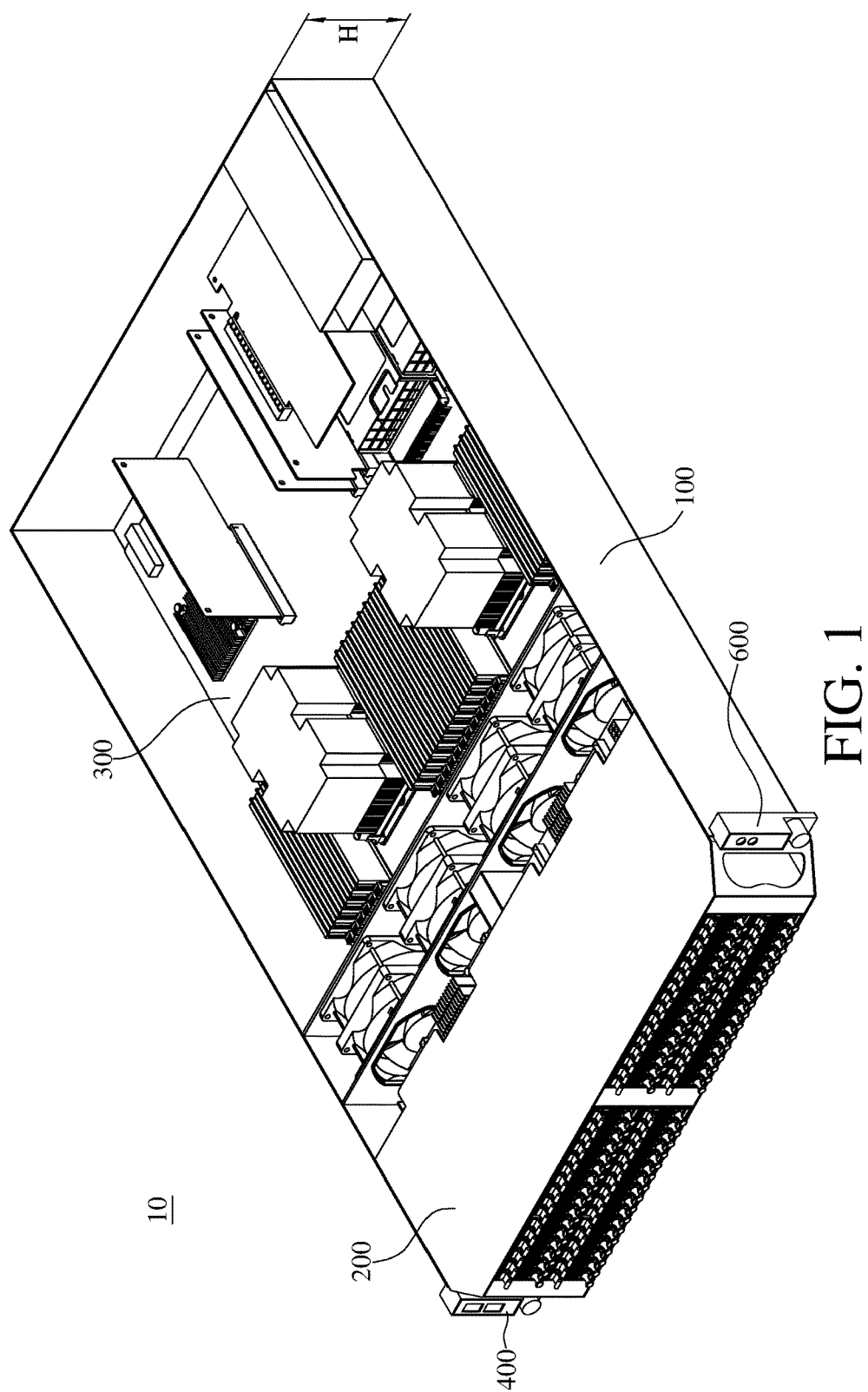
FIG. 1 is a perspective view of a server according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
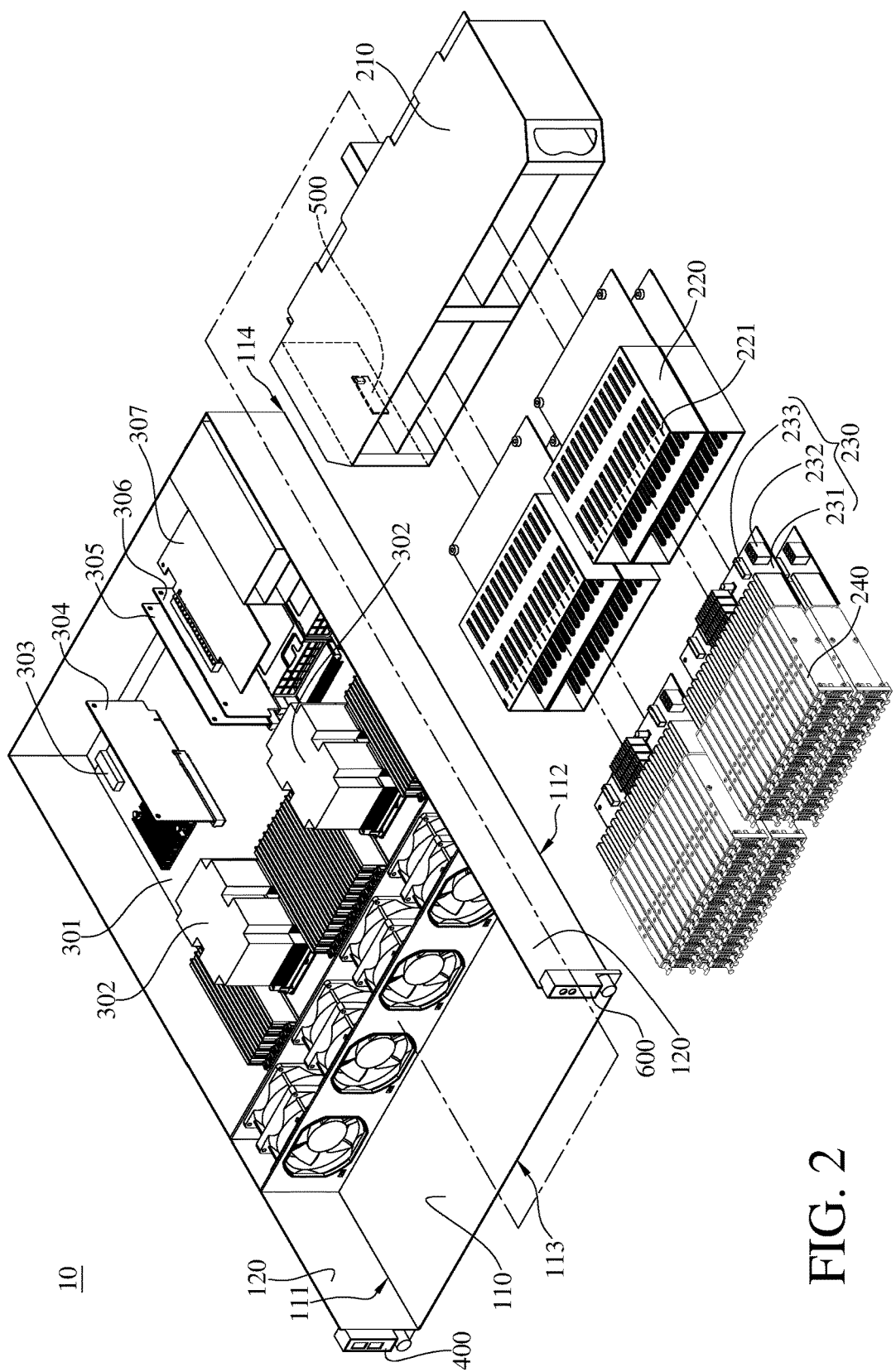
FIG. 2 is an exploded view of the serve in FIG. 1.

Please refer to FIG. 1 to FIG. 2. FIG. 1 is a perspective view of a server according to the first embodiment of the present disclosure. FIG. 2 is an exploded view of the serve in FIG. 1.

This embodiment provides a server 10, and the server 10 has a height H of, for example, 2U. It is widely known that the "U" is an abbreviation of a rack unit, and "1U" is a unit of measure defined as 1.75 inches (44.45 millimeters). In this embodiment, the "U" is used to describe the height H of the server 10, and thus the height H of the server 10 is approximately 3.5 inches (88.9 millimeters).

In this embodiment, the server 10 includes a casing 100, a storage module 200, a motherboard 300, a universal serial bus board 400, a heat sensing board 500 and a light emitting board 600. The casing 100 includes a bottom plate 110 and two side plates 120. The bottom plate 110 has a first side 111, a second side 112, a third side 113 and a fourth side 114. The first side 111 is opposite to the second side 112. The third side 113 is opposite to the fourth side 114. The third side 113 and the fourth side 114 are located between the first side 111 and the second side 112. Two side plates 120 respectively stand on the first side 111 and the second side 112.

The storage module 200 is disposed on the bottom plate 110. The storage module 200 includes a cage 210, a plurality of sub-cages 220, a plurality of back panels 230 and a plurality of storage units 240. The cage 210 is disposed between the two side plates 120. The amount of the sub-cages 220 is, for example, four, and these sub-cages 220 are disposed in the cage 210. In each sub-cage 220, a side of the sub-cage 220 that is away from the bottom plate 110 has a plurality of engagement slots 221.

The amount of the back panels 230 is, for example, four, and these back panels 230 are respectively disposed in the sub-cages 220.

The amount of the storage units 240 is, for example, sixty-four. These storage units 240 are respectively detachably disposed in the sub-cages 220, and the back panels 230 are respectively electrically connected to the storage units 240 that are located in the same sub-cage 220. For instance, sub-cages 220 each have sixteen storage units 240, and the back panel 230 in each sub-cage 220 is electrically connected to the sixteen storage units 240 in the same sub-cage 220.

Figure 3:
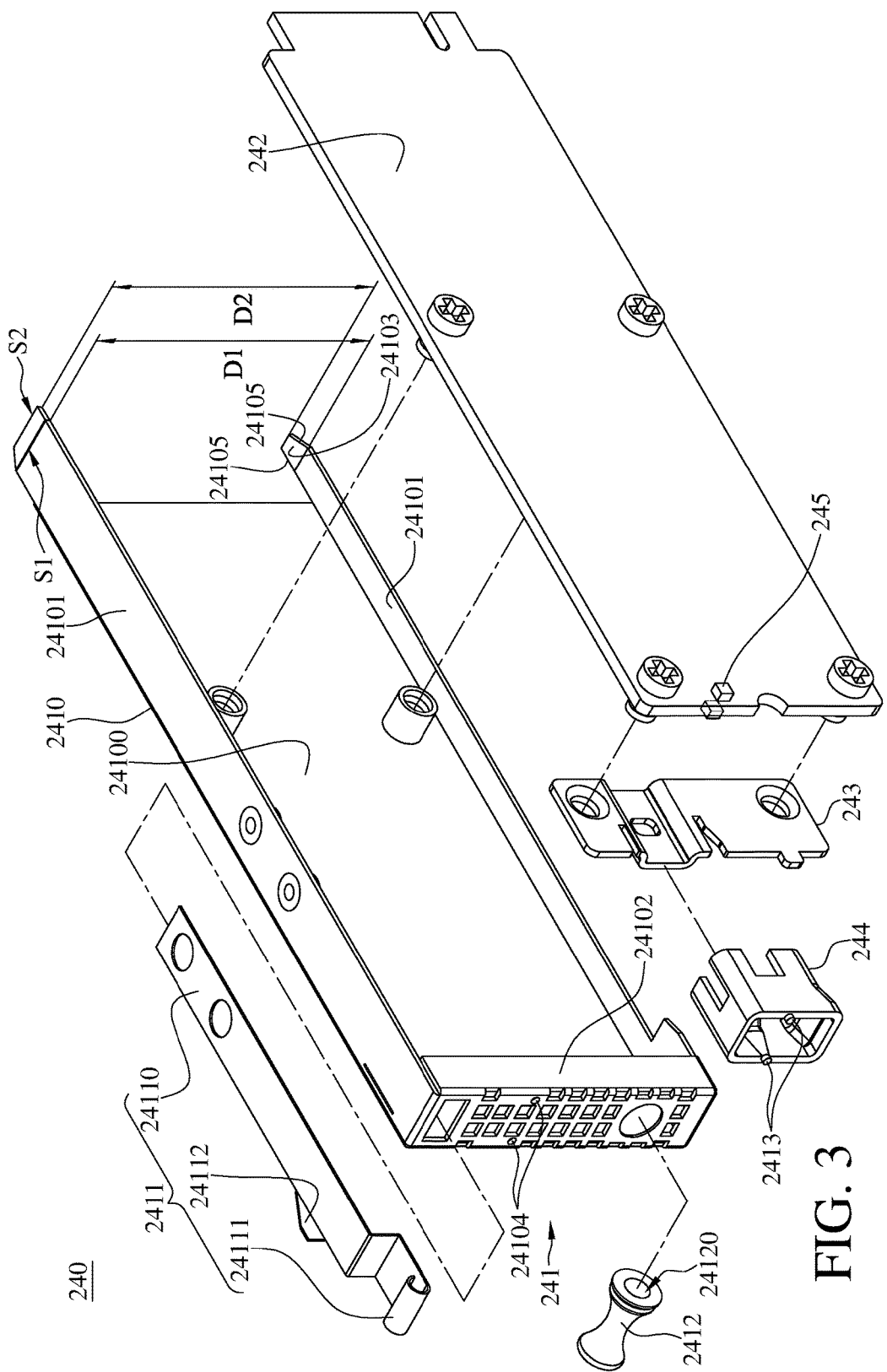
FIG. 3 is an exploded view of a storage unit of the server in FIG. 1.

Please refer to FIG. 2 and FIG. 3. FIG. 3 is an exploded view of a storage unit of the server in FIG. 1. The storage units 240 each include a disk frame 241, a storage card 242, a mount board 243, a light guiding frame 244 and two light emitting components 245.

The disk frames 241 each include a cover 2410, a latch 2411 and a handle 2412.

These covers 2410 each include a top cover portion 24100, two side cover portions 24101, a front cover portion 24102 and two guiding plates 24103. In each cover 2410, the two side cover portions 24101 are respectively disposed on two opposite sides of the top cover portion 24100, the front cover portion 24102 is connected to the top cover portion 24100 and the two side cover portions 24101, and the front cover portion 24102 has a plurality of through holes 24104. Also, the two guiding plates 24103 are respectively connected to two sides of the two side cover portions 24101 that are located away from the front cover portion 24102, and the two guiding plates 24103 each have a first guiding side S1 and a second guiding side S2 that are opposite to each other. The two first guiding sides S1 are respectively connected to the two side cover portions 24101. A distance D1 between the two first guiding sides S1 is larger than a distance D2 between the two second guiding sides S2. Thus, these storage units 240 can be guided into the sub-cages 220 via the guiding plates 24103. In addition, the two second guiding sides S2 each have two guiding edges 24105. The four guiding edges 24105 help the guiding plates 24103 to be inserted into the sub-cages 220.

Each latch 2411 includes a mount portion 24110, a press portion 24111 and an engaging portion 24112. In each disk frame 241, the mount portion 24110 is fixed to one of side cover portion 24101. The press portion 24111 protrudes in a direction away from the front cover portion 24102, and the engaging portion 24112 protrudes in a direction away from the side cover portion 24101 that fixes the mount portion 24110.

The handles 2412 are disposed on the front cover portions 24102, and each handle 2412 has a hole 24120.

The storage cards 242 are, for example, M.3 solid-state disks, and the latches 2411 are respectively engaged into the engagement slots 221, such that the storage cards 242 are able to be fixed in the sub-cages 220. It is noted that the type of the storage cards is not restricted. In other embodiments, the storage cards may be M.2 solid-state disks.

Figure 4:
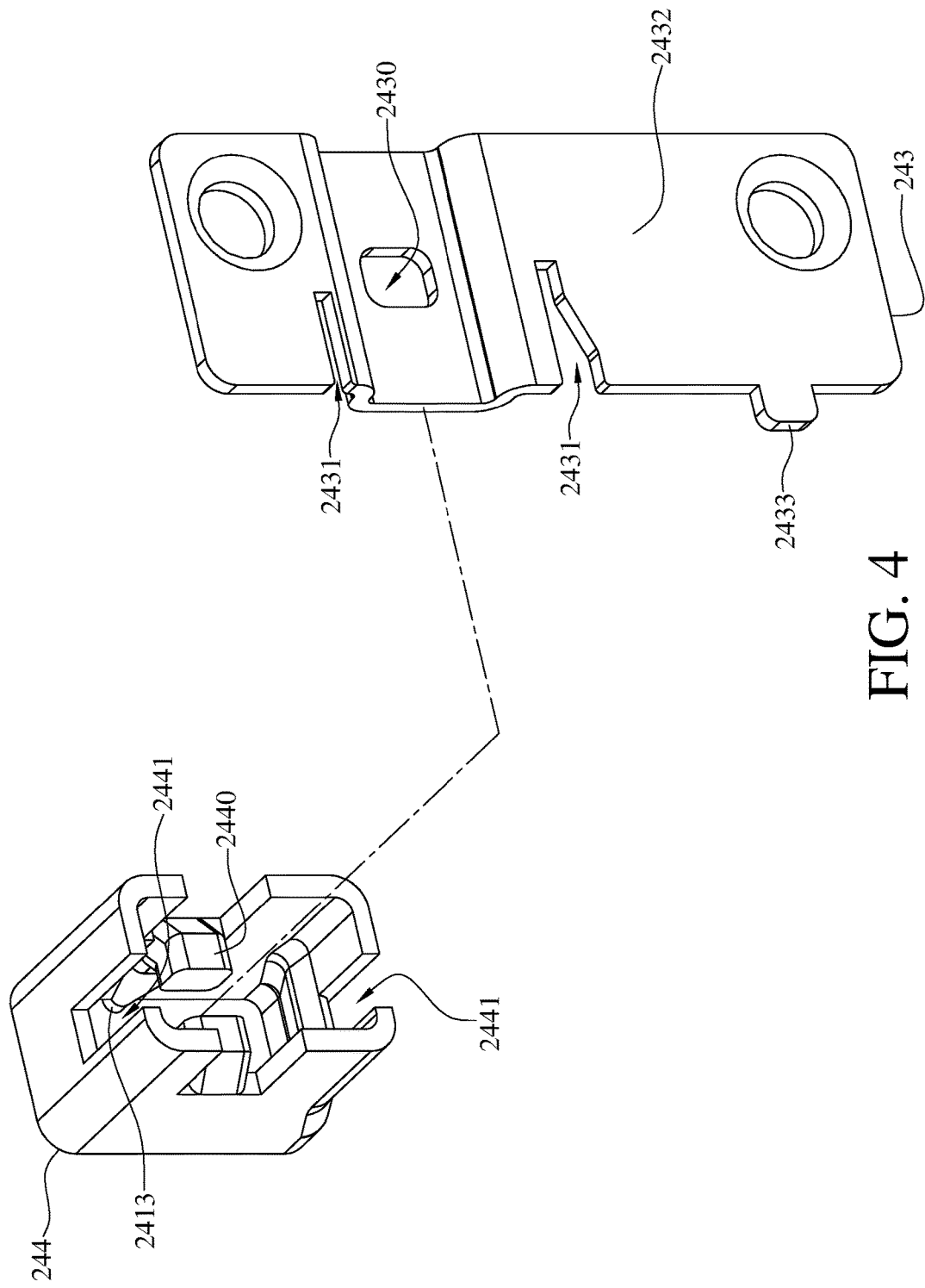
FIG. 4 is a perspective view of a mount board and a light guiding frame of the storage unit in FIG. 3.

Please refer to FIG. 4. FIG. 4 is a perspective view of a mount board and a light guiding frame of the storage unit in FIG. 3. Each mount board 243 includes an engaging portion 2432 and a protrusion 2433, and each mount board 243 has a first engagement slot 2430 and the two second engagement slots 2431. In each storage unit 240, the protrusion 2433 protrudes from the engaging portion 2432 and is engaged into the hole 24120 of the handle 2412, and the first engagement slot 2430 and the two second engagement slots 2431 are located on the engaging portion 2432.

Each light guiding frame 244 has two first engagement pieces 2440 and two third engagement slots 2441. In each storage unit 240, one of the first engagement pieces 2440 is engaged into the first engagement slot 2430 of the mount board 243, the light guiding frame 244 is engaged into the two second engagement slots 2431 of the mount board 243, and the storage card 242 and the mount board 243 are engaged into the two third engagement slots 2441. It is noted that the quantity of the first engagement pieces 2440 on each light guiding frame 244 is not restricted. In other embodiments, each light guiding frame may only have one first engagement piece.

In each storage unit 240, the disk frame 241 further includes two light guiding pillars 2413 disposed on the light guiding frame 244. The two light guiding pillars 2413 and the light guiding frame 244 are, for example, made of a single piece by an injection molding process. The two light guiding pillars 2413 respectively penetrate through two of the through holes 24104 on the front cover portion 24102. The two light emitting components 245 are, for example, light-emitting diodes, and are respectively disposed on two opposite sides of the storage card 242 and respectively corresponding to the two light guiding pillars 2413. Specifically, light emitted from the two light emitting components 245 can be respectively transmitted to the two light guiding pillars 2413 and then the two light guiding pillars 2413 transmit the light outside through the through holes 24104.

Please refer to FIG. 2. The motherboard 300 includes a circuit board 301, two central processing units 302, a signal output port 303, a first signal magnifying board 304, a second signal magnifying board 305, a riser card 306 and a third signal magnifying board 307.

The circuit board 301 is disposed on the bottom plate 110 and is located between the storage module 200 and the fourth side 114 of the bottom plate 110. Additionally, the back panels 230 each include a circuit base board 231 and a power connector 232. In each back panel 230, the power connector 232 is disposed on a side of the circuit base board 231 away from the bottom plate 110, and the power connector 232 is electrically connected to the circuit board 301.

The two central processing units 302 are disposed on a side of the circuit board 301 close to the storage module 200. The signal output port 303 is, for example, an internet port, and the signal output port 303, the first signal magnifying board 304 and the second signal magnifying board 305 are disposed on a side of the circuit board 301 away from the storage module 200. It is noted that the amount of the central processing units 302 in the motherboard 300 is not restricted. In other embodiments, the motherboard may only include one central processing unit.

The first signal magnifying board 304 and the second signal magnifying board 305 are, for example, perpendicular to the circuit board 301, and the first signal magnifying board 304 is closer to the signal output port 303 than the second signal magnifying board 305. The riser card 306 is disposed on a side of the second signal magnifying board 305 away from the first signal magnifying board 304. The third signal magnifying board 307 is disposed on a side of the riser card 306 away from the second signal magnifying board 305, and the third signal magnifying board 307 is, for example, parallel to the circuit board 301.

In addition, the back panels 230 each further include a plurality of signal connectors 233. In each back panel 230, these signal connectors 233 are disposed on a side of the circuit base board 231 away from the bottom plate 110, and the amount of the signal connectors 233 is, for example, two. The first signal magnifying board 304, the second signal magnifying board 305 and the third signal magnifying board 307 are electrically connected to the signal output port 303 and the signal connectors 233 of the back panels 230 in the storage module 200. As a result, when the signal output port 303 receives data from the internet, data that is magnified by the signal magnifying boards 304, 305 and 307 can be transmitted to and then be stored in the storage module 200. On the other hand, the data stored in the storage module 200 may also be transmitted to the internet via the signal output port 303 after being magnified by the signal magnifying boards 304, 305 and 307.

The universal serial bus board 400, the heat sensing board 500 and the light emitting board 600 are electrically connected to the motherboard 300. The universal serial bus board 400 is configured to make the reading and the writing of the data in the server 10 more convenient. The heat sensing board 500 is configured to monitor the work temperature inside the server 10 in order to maintain a desired heat circulation in the server 10. The light emitting board 600 is configured to display different work states of the server 10.

Figure 5:
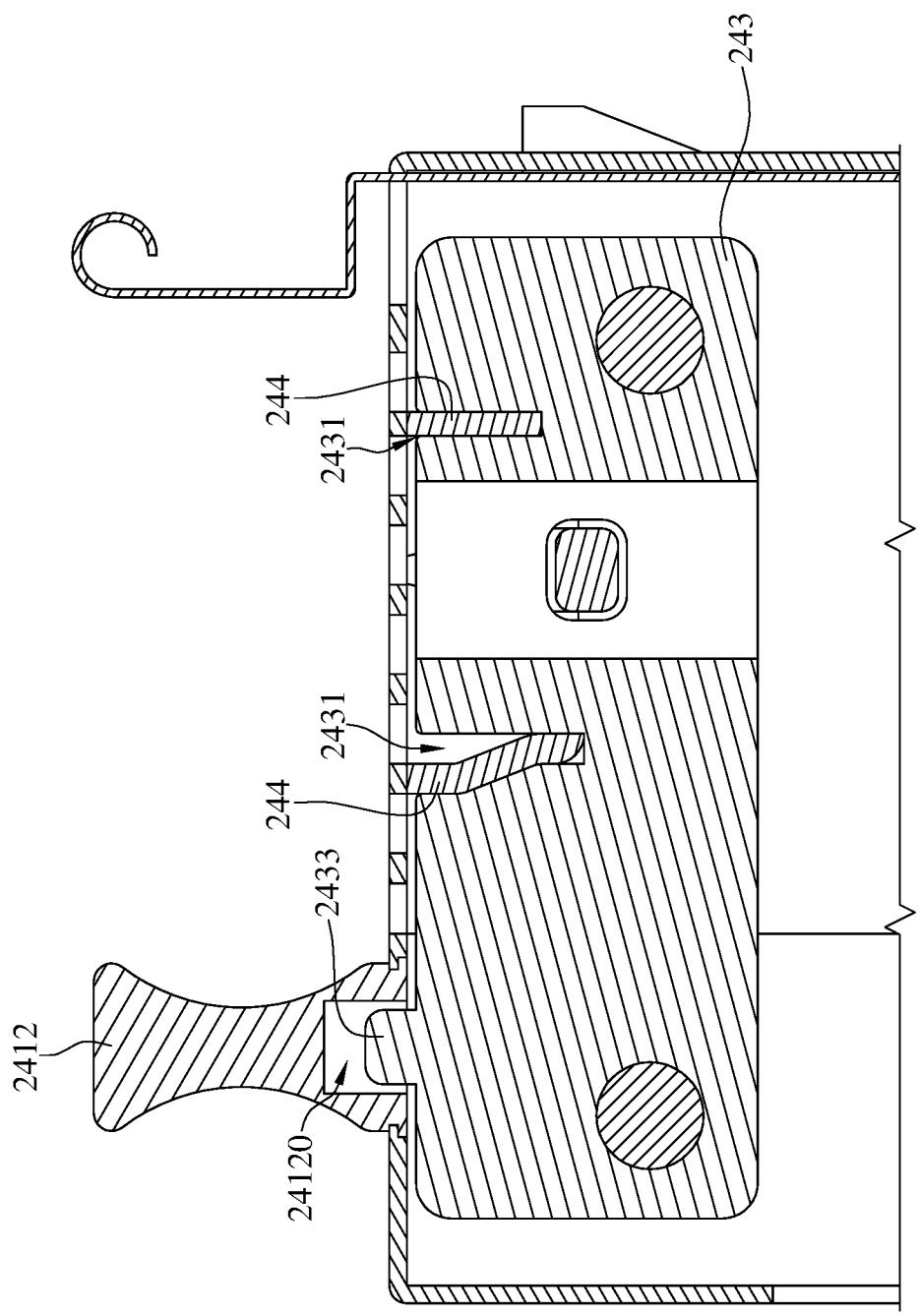
FIG. 5 is a cross sectional view of the storage unit of the server in FIG. 1.
Figure 6:
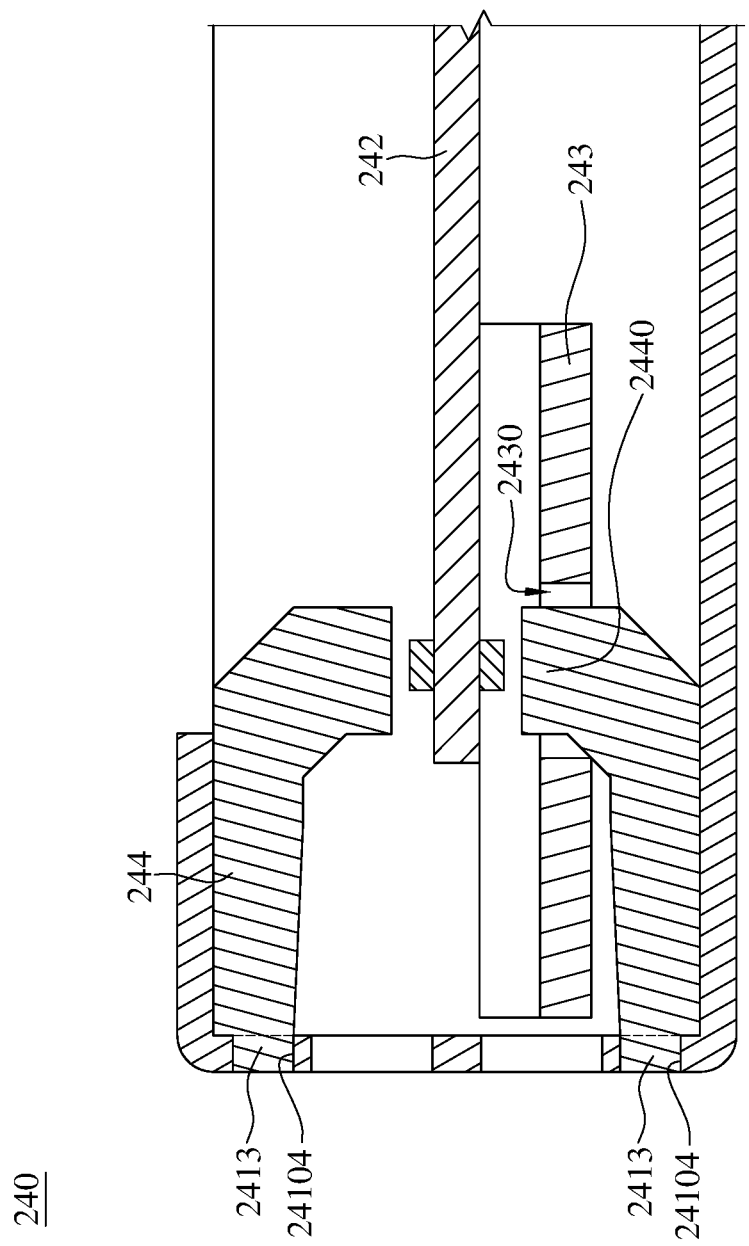
FIG. 6 is a cross sectional view of the storage unit in FIG. 5 in another viewing angle.
Figure 7:
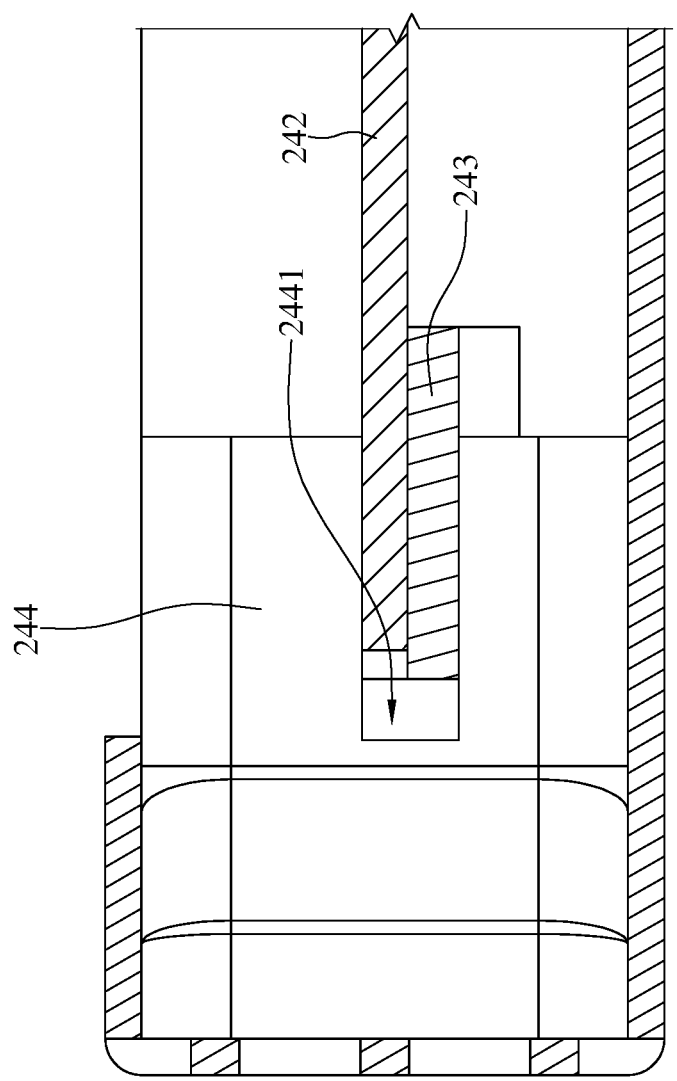
FIG. 7 is a cross sectional view of the storage unit in FIG. 6 along another cutting line.

Please refer to FIG. 5, FIG. 6 and FIG. 7. FIG. 5 is a cross sectional view of the storage unit of the server in FIG. 1. FIG. 6 is a cross sectional view of the storage unit in FIG. 5 in another viewing angle. FIG. 7 is a cross sectional view of the storage unit in FIG. 6 along another cutting line. As shown in FIG. 5, in each storage unit 240, the protrusion 2433 of the mount board 243 is engaged into the hole 24120 of the handle 2412, and the light guiding frame 244 is engaged into the two second engagement slots 2431 of the mount board 243. As shown in FIG. 6, the two light guiding pillars 2413 are respectively disposed through two of the through holes 24104. In each storage unit 240, one of the first engagement pieces 2440 of the light guiding frame 244 is engaged into the first engagement slot 2430 of the mount board 243. As shown in FIG. 7, the storage card 242 and the mount board 243 are engaged into the two third engagement slots 2441 of the light guiding frame 244.

As a result, the mount boards 243 and the light guiding frames 244 can fix the storage cards 242 to the disk frames 241 in multiple directions, such that the storage cards 242 are able to be stably disposed on the disk frames 241.

Additionally, because the protrusion 2433 of the mount board 243 should be engaged into the hole 24120 of the handle 2412, and the light guiding frame 244 should be engaged into the two second engagement slots 2431 of the mount board 243, the insertion of the storage card 242 to the disk frames 241 is mistake proofing so that it can prevent the damage of the structure of the storage cards 242 or disk frames 241 caused by reversely inserting the storage card 242 to the disk frames 241.

Figure 8:
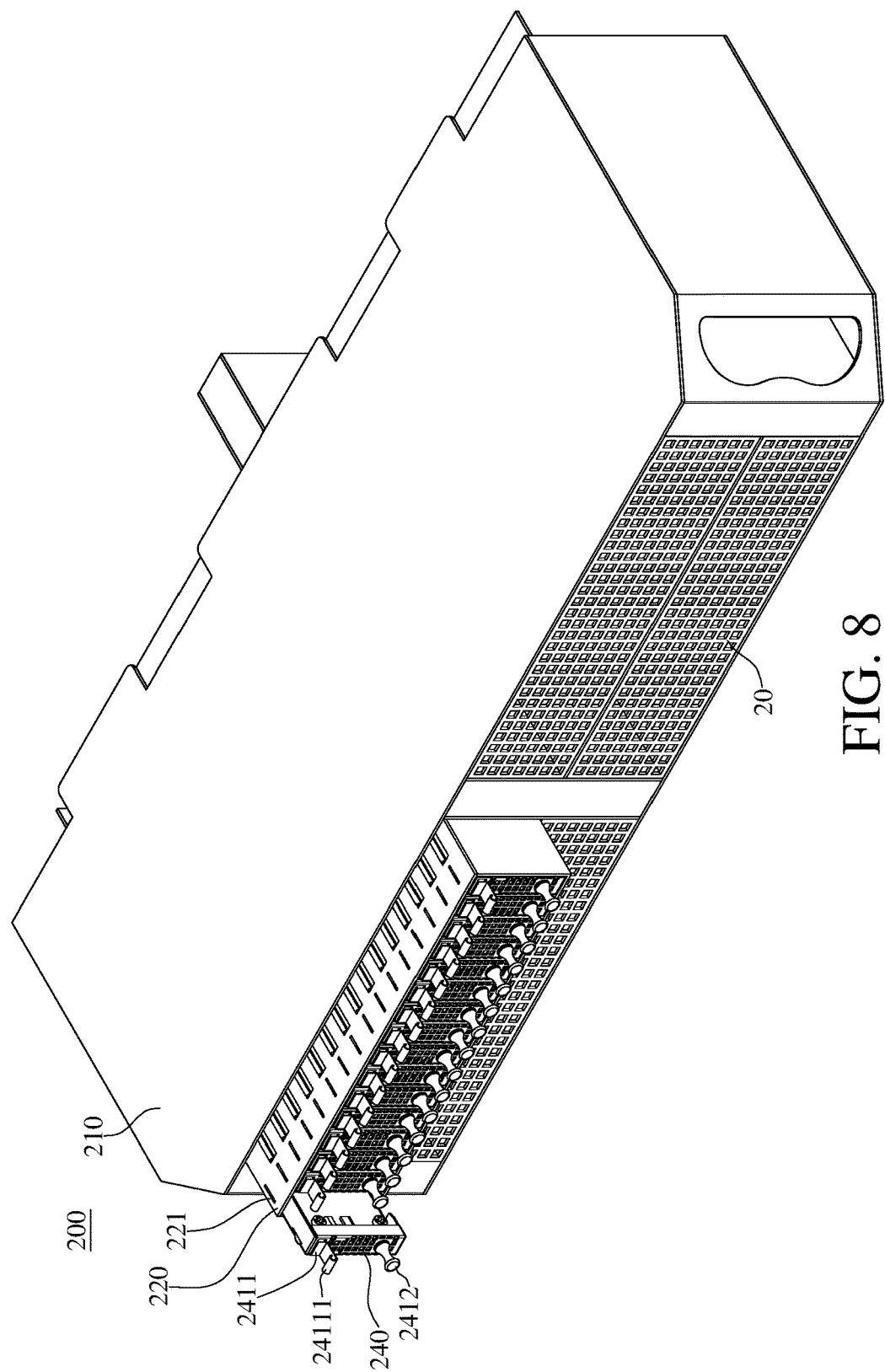
FIG. 8 is a perspective schematic view of a storage module of the server in FIG. 1 as a part of the storage units are detached from the sub-cages.

Please refer to FIG. 2, FIG. 3 and FIG. 8. FIG. 8 is a perspective schematic view of a storage module of the server in FIG. 1 as a part of the storage units are detached from the sub-cages. When a user needs to detach one of the storage units 240 from the corresponding sub-cage 220, the user is only required to hold the handle 2412 by one hand and to press the press portion 24111 of the latch 2411 by the other hand, and then the engaging portion 24112 of the latch 2411 can be detached from the corresponding engagement slot 221 of the sub-cage 220. By doing so, the storage unit 240 can be taken out from the sub-cage 220. It is understood that each storage unit 240 can be detached independently.

In addition, because each sub-cage 220 has the back panel 230 that is independent from those in other sub-cages 220, the sub-cages 220 can individually transmit signal to the motherboard 300. Accordingly, other than that the storage units 240 can be individually detached, the sub-cages 220 can further modularize the storage module 200 into four modules that can operate independently, allowing the user to flexibly utilize the server 10.

Furthermore, when there is no storage unit 240 in the sub-cages 220, a protection plate 20 can be disposed on each sub-cage 220 to prevent any unwanted object from entering into the sub-cages 220 to affect the operation of the back panels 230. For example, as the storage module 200 shown in FIG. 8, only one of the four sub-cages 220 is disposed with the storage units 240, and thus there are three protection plates 20 disposed on the other three sub-cages 220 that have no storage unit 240.

Take one storage unit 240 and its corresponding sub-cage 220 for example, when the user needs to dispose the storage unit 240 on the sub-cage 220, the user is only required to push the storage unit 240 toward the sub-cage 220. In detail, while pushing the storage unit 240, the two guiding plates 24103 guide the storage unit 240 into the sub-cage 220, the engaging portion 24112 of the latch 2411 is engaged into the engagement slot 221 of the sub-cage 220, such that the storage unit 240 is fixed to the sub-cage 220, and then the storage card 242 is inserted into the corresponding back panel 230. The latch 2411 is only allowed to be engaged into the engagement slot 221 in a specific position, thus the insertion of the storage unit 240 to the sub-cage 220 is mistake proofing, which is able to prevent the damage to the storage card 242 or the back panel 230 caused by reversely inserting the storage card 242 into back panel 230.

According to the serve of the above embodiments, because the cage of the storage module is disposed on the two side plates, the circuit board of the motherboard is located between the storage module and the fourth side, and the third signal magnifying board is disposed on the riser card and parallel to the circuit board, the amount of the storage units that the server can accommodate is increased. As a result, the density of the storage units in the server is increased, which helps to increase the storage and write/read speed of the server.

Additionally, with the help of the corresponding features of the sub-cages and the disk frames, the storage units inside the sub-cages can be independently operated, the insertion of the storage units to the sub-cages are mistake proofing, allowing the user to flexibly adjust the amount of the storage units inside the sub-cages and preventing the damage to the storage units or back panels caused by reversely inserting the storage units into back panels.

Furthermore, because of the structure cooperation between the mount boards, the light guiding frames and the disk frames, the storage cards can be fixed to the disk frames in multiple directions to make the storage cards be stably disposed on the disk frames. Also, the insertion of the storage cards to the disk frames is mistake proofing, so as to prevent the structure of the storage units or the disk frames from damaging due to reversely insert the storage units into the disk frames.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server comprising:
a casing, comprising a bottom plate and two side plates, the bottom plate having a first side, a second side, a third side and a fourth side, the first side opposite to the second side, the third side and the fourth side located between the first side and the second side, the third side opposite to the fourth side, and the two side plates respectively standing on the first side and the second side;
a storage module, disposed on the bottom plate, the storage module comprising a cage, a plurality of sub-cages, a plurality of back panels and a plurality of storage units, the cage disposed on the two side plates, the plurality of sub-cages disposed in the cage, the plurality of back panels respectively disposed in the plurality of sub-cages, the plurality of storage units respectively detachably disposed in the plurality of sub-cages to electrically connect to the back panel that is located in the same sub-cage; and
a motherboard, comprising a circuit board, at least one central processing unit, a signal output port, a first signal magnifying board, a second signal magnifying board, a riser card and a third signal magnifying board, the circuit board disposed on the bottom board and located between the storage module and the fourth side, the at least one central processing unit disposed on a side of the circuit board close to the storage module, the signal output port, the first signal magnifying board and the second signal magnifying board disposed on a side of the circuit board away from the storage module, the first signal magnifying board and the second signal magnifying board perpendicular to the circuit board and the first signal magnifying board located closer to the signal output port than the second signal magnifying board, the riser card disposed on a side of the second signal magnifying board away from the first signal magnifying board, the third signal magnifying board disposed on a side of the riser card away from the second signal magnifying board and the third signal magnifying board parallel to the circuit board, the first signal magnifying board, the second signal magnifying board and the third signal magnifying board electrically connected to the signal output port and the storage module.

2. The server according to the claim 1, wherein in each of the plurality of back panels, a plurality of signal connectors and a power connector are disposed on a side of the back panel away from the bottom plate, the back panel is electrically connected to the first signal magnifying board, the second signal magnifying board and the third signal magnifying board via the plurality of signal connectors and are electrically connected to the circuit board via the power connector.

3. The server according to the claim 1, wherein the plurality of storage units each comprise a disk frame and a storage card, the disk frames each comprise a cover and a latch; in each of the disk frames, the cover comprises a top cover portion, two side cover portions and a front cover portion, the two side cover portions are respectively disposed on two opposite sides of the top cover portion, the front cover portion is connected to the top cover portion and the two side cover portions, the latch comprises a mount portion, a press portion and an engaging portion, the mount portion is fixed to one of the side cover portion, the press portion protrudes in a direction away from the front cover portion and the engaging portion protrudes in a direction away from the side cover portion that fixes with the mount portion, in each of the plurality of sub-cages, a side of the sub-cage away from the bottom plate has a plurality of engagement slots, the latches are respectively engaged into the plurality of engagement slots in order to mount the storage cards on the plurality of sub-cages via the disk frames.

4. The server according to the claim 3, wherein each of the covers further comprise two guiding plates, in each of the covers, the two guiding plates are respectively connected to two sides of the two side cover portions away from the front cover portion, and a distance between two sides of the two guiding plates that are connected to the two side cover portions is larger than a distance between another two sides of the two guiding plates that are located away from the two side cover portions.

5. The server according to the claim 4, wherein in each of the covers, the another two sides of the two guiding plates, that are located away from the two side cover portions, each have two guiding edges, and the four guiding edges help the two guiding plates to slide in the plurality of sub-cages.

6. The server according to the claim 3, wherein the plurality of storage units each further comprise a mount board and a light guiding frame; in each of the plurality of storage units, the mount board has a first engagement slot and two second engagement slots, the light guiding frame has a first engagement piece and two third engagement slots, the first engagement piece is engaged into the first engagement slot, the light guiding frame is engaged into the two second engagement slots, and the storage card and the mount board are engaged into the two third engagement slots.

7. The server according to the claim 6, wherein each of the disk frames further comprise a handle; in each of the disk frames, the handle is disposed on the front cover portion, the handle has a hole, the mount board comprises an engaging portion and a protrusion, the first engagement slot and the two second engagement slots are located in the engaging portion, and the protrusion protrudes from the engaging portion and is engaged into the hole.

8. The server according to the claim 6, wherein in each of the disk frames, the disk frame further comprises two light guiding pillars disposed on the light guiding frame, the front cover portion has a plurality of through holes, the two light guiding pillars respectively penetrate through two of the plurality of through holes, the storage unit further comprises two light emitting components respectively disposed on two opposite sides of the storage card and respectively corresponding to the two light guiding pillars.

9. The server according to the claim 3, wherein the server has a height of 2U, an amount of the plurality of sub-cages is four, the storage card is M.3 solid-state disk or M.2 solid-state disk, and there are sixteen of the storage units disposed in each of the four sub-cages.

10. The server according to the claim 1, further comprises a universal serial bus board, a heat sensing board and a light emitting board which are electrically connected to the motherboard.

* * * * *